MONOSTABLE TUNNEL DIODE CIRCUIT COUPLED THROUGH TUNNEL RECTIFIER TO BISTABLE TUNNEL DIODE CIRCUIT
Filed Nov. 2, 1960

INVENTOR.
MELVIN M. KAUFMAN
BY
Carl V. Olson
Attorney 3,168,652
Patented Feb. 2, 1965

3,168,652

MONOSTABLE TUNNEL DIODE CIRCUIT COUPLED THROUGH TUNNEL RECTIFIER TO BISTABLE TUNNEL DIODE CIRCUIT

Melvin M. Kaufman, Merchantville, N.J., assignor to Radio Corporation of America, a corporation of Delaware Filed Nov. 2, 1960, Ser. No. 66,802
5 Claims. (Cl. 307—88.5)

This invention relates to pulse circuits including negative resistance diodes such as tunnel diodes, and more particularly to a two-stage monostable circuit which provides an output pulse of predetermined width in response to an input trigger pulse. By way of example, the invention is useful in very high speed electronic computer and data processing apparatus.

Tunnel diodes have a current-voltage characteristic including low voltage and high voltage positive resistance regions separated by a negative resistance region. When a tunnel diode is appropriately biased, its operating point can be made to switch between the two positive resistance regions in response to an input signal. A monostable tunnel diode circuit is one which includes an inductor and is so biased that it switches from one state to the other, and back again, in response to an input trigger pulse. The output signal is a pulse having a width determined primarily by the value of the indicator. The output pulse typically has a downwardly sloping top which results from the characteristics of the tunnel diode in conjuction with the varying time constants of the circuit. There are many applications, such as in electronic computers, where a flat-topped output pulse is desired, as where the coincidence of two pulses must be detected and where there is no assurance that the two pulses will have leading edges in perfect time coincidence.

It is therefore a general object of this invention to provide an improved negative-resistance diode pulse circuit which provides output pulses with substantially flat tops.

It is another object to provide an improved monostable tunnel diode pulse circuit exhibiting good current gain.

It is a further object to provide an improved pulse circuit including two tunnel diode circuits coupled together by means of a tunnel rectifier.

In one aspect the invention comprises a monostable tunnel diode stage followed by a bistable tunnel diode stage. The stages are coupled together by means of a nonlinear impedance element such as a tunnel rectifier. When an input trigger pulse is applied to the monostable stage, the stage switches from an initial state to the other state, and then automatically returns to the initial stage. The bistable stage follows the monostable stage in switching between states. The bias voltages on the stages are selected with relation to the characteristics of the diodes so that the tunnel rectifier coupling the two stages is substantially non-conductive when both stages are in their high voltage states, or both are in their low voltage states. The tunnel rectifier becomes substantially conductive only during the actual switching, and only after the operating point of the monostable diode encounters the negative resistance region of its characteristic curve. By this construction, the bistable stage is isolated from the undesired voltage changes of the monostable stage, and the output pulse provided by the bistable stage has a substantially flat top.

These and other objects and aspects of the invention will be apparent from the following more detailed description taken in conjunction with the appended drawing, wherein.

Figure 1:
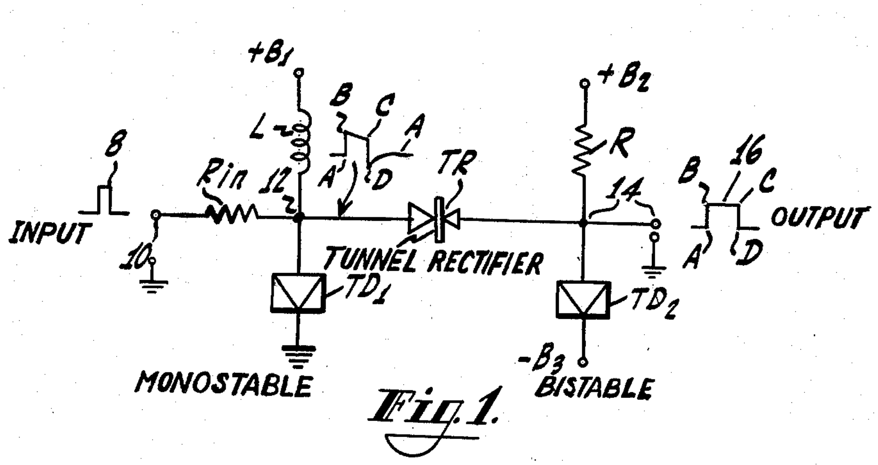
FIGURE 1 is a circuit diagram of a two-stage monostable circuit constructed according to the teachings of the invention.

The monostable circuit of FIGURE 1 includes a first monostable stage including a tunnel diode $TD_1$ and a second bistable stage including tunnel diode $TD_2$. The first monostable stage includes an inductor L connected in series with the tunnel diode $TD_1$, the series combination being connected between the $+B_1$ and ground potential terminals of a direct current power supply (not shown). A positive input pulse 8 applied to the input terminal 10 is coupled through an input resistor $R_{in}$ to the junction point 12 between the inductor L and the tunnel diode $TD_1$.

The second bistable stage of the circuit of FIGURE 1 includes a resistor R connected in series with the tunnel diode $TD_2$ between the $+B_2$ and $-B_3$ terminals of a direct current power supply (not shown). The two stages are coupled together by means of a nonlinear impedance element such as a tunnel rectifier TR connected from the junction point 12 to the junction point 14 between the resistor R and tunnel diode $TD_2$. The positive output pulse 16 is obtained from the output terminal 14.

Figure 2:
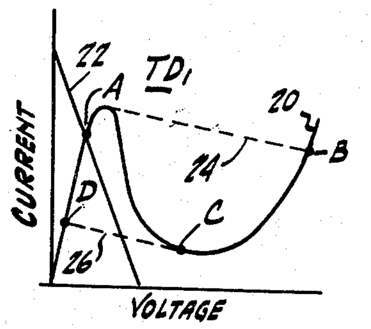
FIGURE 2 is a chart of the current-voltage characteristic of the tunnel diode $TD_1$ in the circuit of FIGURE 1.

FIGURE 2 shows the current-voltage characteristic 20 of the tunnel diode $TD_1$. The bias voltage $+B_1$ is selected to provide a direct current load line 22 intersecting the diode characteristic curve 20 at a point A in the low voltage positive resistance region of the characteristic curve. When the positive input pulse 8 is applied to the tunnel diode $TD_1$, the operating point of the diode moves upward from the point A, over the peak of the curve, where the negative resistance region of the characteristic is encountered. The operating point then very rapidly switches along the dotted line 24 to an operating point B in the high voltage positive resistance region of the characteristic curve. Thereafter the operating point moves from the point B along the characteristic curve to the point C where the negative resistance region of the characteristic curve is again encountered. The time required for the operating point to move from point B to point C is determined primarily by the changing time constant of the inductor L and the changing resistance of the diode $TD_1$. When the operating point reaches point C and encounters the negative resistance region, the operating point switches rapidly along the dotted line 26 to the point D. Then the operating point moves along the curve to the initial point A at a rate determined by the varying time constant of the circuit.

The voltage waveform across the tunnel diode $TD_1$ is represented in FIGURE 1 with designations A, B, C and D indicating the points on the waveform corresponding with similarly designated points on the chart of FIGURE 2. It will be seen that the movement of the operating point in FIGURE 2 from point B to point C occupies a period of time corersponding with the width of the pulse across the diode $TD_1$. It will also be observed from FIGURE 2 that the voltage across the diode decreases as the operating point moves from point B to point C, and that this reduction in voltage causes the downwardly sloping top on the pulse developed across the tunnel diode $TD_1$.

Figure 3:
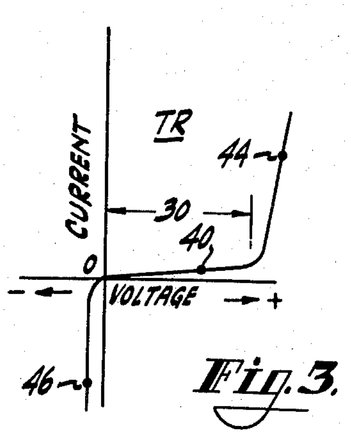
FIGURE 3 is a curve of the current-voltage characteristic of the tunnel rectifier TR in the circuit of FIGURE 1.

FIGURE 3 shows the current-voltage characteristic of the tunnel rectifier TR. It will be observed that the characteristic of a tunnel rectifier is similar to that of a tunnel diode, except that the peak current is substantially the same as the valley current and is substantially zero. The characteristic is thus one wherein the tunnel rectifier is substantially non-conductive when the voltage applied thereacross is within the range designated 30. For voltage values more positive than, or more negative than, voltages in the range 30, the tunnel rectifier TR presents a low impedance and is highly conductive.

Figure 4:
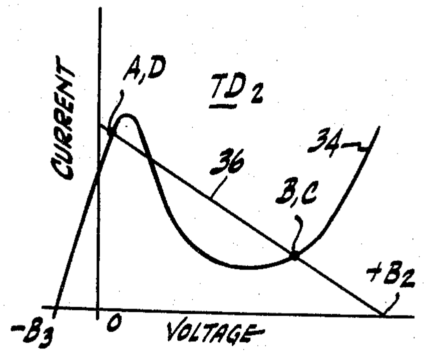
FIGURE 4 is a chart of the current-voltage characteristics of the tunnel diode $TD_2$ in the circuit of FIGURE 1.

FIGURE 4 shows the current-voltage characteristic 34 of the tunnel diode $TD_2$ in the circuit of FIGURE 1. The curve 34 is shifted to the left to reflect the effect of the negative bias voltage $-B_3$. The bias voltages and the resistor R are selected to provide a current load line 36 which intersects the low voltage positive resistance region of the diode curve at point A, D, and intersects the high voltage positive resistance region of the diode curve at point B, C.

The bias voltages $+B_1$, $+B_2$ and $-B_3$ in the circuit of FIGURE 1 are selected with relation to the current-voltage characteristics of the tunnel diodes $TD_1$ and $TD_2$, and the tunnel rectifier TR so that, under the normal initial conditions, the voltage across the tunnel rectifier TR has a value such as is represented at 40, within the voltage range 30, in the chart of FIGURE 3. When a voltage of value corresponding to the point 40 is applied across the tunnel rectifier TR, the rectifier presents a very high impedance to the flow of current therethrough and is substantially non-conductive.

The operation of the circuit of FIGURE 1 will now be described. The tunnel diode $TD_1$ is normally in a low voltage state represented by the point A on the low voltage positive resistance region of its characteristic curve. The tunnel diode $TD_2$ is similarly in a low voltage state represented by the point A, D in the low voltage positive resistance region of its characteristic curve. Because of the values of the bias potentials $+B_1$, $+B_2$ and $-B_3$, the voltages at the junction point 12 are more positive than the voltage at the junction point 14. Therefore, the tunnel rectifier TR is biased in the forward direction by a voltage such as is represented by the voltage 40 in the chart of FIGURE 3. It will be noted that when this voltage is applied across the tunnel rectifier, the tunnel rectifier presents a very large impedance to the flow of current, and very little current flows through the tunnel rectifier. Therefore, in the initial state, the two tunnel diode stages are substantially isolated from each other.

When an input trigger pulse 8 is applied to the tunnel diode $TD_1$, the operating point (FIGURE 2) rises from point A over the peak of the characteristic curve, encounters the negative resistance region, and then switches rapidly along dotted line 24 to the high voltage operating point B. When the operating point encounters the negative resistance region and starts switching rapidly toward point B, the voltage at the junction point 12 suddenly becomes much more positive than it was before. The increased positive voltage across the tunnel rectifier TR causes the tunnel rectifier to exhibit a very low impedance to the flow of current. This condition may be represented by the operating point 44 on the characteristic curve of the tunnel rectifier (FIGURE 3). The tunnel diode $TD_1$ thus supplies current through the tunnel rectifier TR to the tunnel diode $TD_2$, and causes the tunnel diode $TD_2$ to switch rapidly from its operating point A, D to a high voltage operating point B, C.

When the tunnel diode $TD_2$ reaches its high voltage state, the tunnel diode $TD_1$ is already in its high voltage state, and consequently there is only a relatively small voltage difference between the junction points 12 and 14. Under these conditions, the voltage across the tunnel rectifier TR is again a value such as the value 40 in the range 30 in FIGURE 3, and substantially no current flows between the tunnel diode stages. This is a very desirable condition because at this time it is desired that the tunnel diode $TD_2$ supply its full current to utilization devices (not shown) connected to the output terminals 14. None of the output current of the tunnel diode $TD_2$ is diverted back toward the preceding tunnel diode $TD_1$.

During the period between times B and C, when an output pulse is available at output terminal 14, the voltage at point 12 (across tunnel diode $TD_1$) is falling as the operating point (FIGURE 2) falls along the characteristic curve from point B to point C. During this interval, the positive voltage across the tunnel rectifier TR is also falling from the voltage 40 (FIGURE 3) toward the zero value at the origin of the chart. When the negative resistance region of the characteristic curve of tunnel diode $TD_1$ is encountered, the voltage across $TD_1$ decreases very rapidly with the result that the voltage at junction point 12 becomes much lower than the voltage at the junction point 14. There is then a large voltage drop across the tunnel rectifier TR in the reverse or negative direction, and the tunnel rectifier has an operating point such as 46 where it presents a very low impedance to the flow of current in the reverse direction. This permits a large current to flow from the tunnel diode $TD_2$ to the tunnel diode $TD_1$, with the result that the tunnel diode $TD_2$ is rapidly switched from its high voltage state at operating point B, C to its low voltage state at operating point A, D.

It will be observed that the tunnel diode $TD_2$ does not start to switch back to its low voltage state until the operating point of the tunnel diode $TD_1$ has encountered the negative resistance region of its characteristic curve and is very rapidly switching to its low voltage state. The tunnel rectifier TR therefore serves to isolate the two stages when they are both in the same voltage state, and serves to couple the stages together only when the first stage of tunnel diode $TD_1$ has encountered its negative resistance region and is thus in the process of very rapidly switching from one state to the other.

While an example of the invention has been described including tunnel diodes and a tunnel rectifier in combination with certain relative bias voltages $+B_1$, $+B_2$ and $-B_3$, it will be understood that the invention can be practiced with other negative resistance diodes and a non-linear impedance element in combination with other bias voltages provided that the necessary relative relationships are maintained.

It is thus apparent that according to this invention there is provided an improved two-stage monostable tunnel diode circuit operative in response to an input trigger pulse to generate an output pulse having a desired flat-top waveform.

What is claimed is:

1. A two-stage monostable circuit comprising a first tunnel diode biased to operate in a monostable manner, a second tunnel diode biased to operate in a bistable manner, a tunnel rectifier coupling said first and second tunnel diodes, means to apply an input trigger pulse to said first tunnel diode, and means to derive an output pulse from said second tunnel diode.

2. A pulse circuit comprising first and second tunnel diodes each having characteristics providing high and low voltage states in positive resistance regions separated by a negative resistance region, said first diode being biased to operate in a monostable manner and said second diode being biased to operate in a bistable manner, means to apply an input signal to said first diode to cause it to switch from an initial voltage state to another voltage state and then automatically return to the initial state, a tunnel rectifier coupling said first and second diodes to cause the second diode to follow the first diode in switching between its two voltage states, said diodes being biased with relation to their characteristics so that said tunnel rectifier is substantially non-conducting when the first and second diodes are both in their low voltage states or are both in their high voltage states, and becomes substantially conducting in one direction only after the operating point of the first diode encounters the negative resistance region of its characteristic in going from its initial state to its other state, and becomes substantially conducting in the other direction only after the operating point of the first diode encounters the negative resistance region in returning to its initial state.

3. A pulse circuit comprising first and second negative resistance diodes each having characteristics providing high and low voltage states in positive resistance regions separated by a negative resistance region, said first diode being biased to operate in a monostable manner and said second diode being biased to operate in a bistable manner, means to apply an input signal to said first diode to cause it to switch from an initial voltage state to another voltage state and then automatically return to the initial state, a tunnel rectifier coupling said first and second diodes to cause the second diode to follow the first diode in switching between its two voltage states, said diodes being biased with relation to their characteristics so that said tunnel rectifier is substantially non-conducting when the first and second diodes are both in their low voltage states or are both in their high voltage states, and becomes substantially conducting in one direction only after the operating point of the first diode encounters the negative resistance region of its characteristic in going from its initial state to its other state, and becomes substantially conducting in the other direction only after the operating point of the first diode encounters the negative resistance region in returning to its initial state.

4. A pulse circuit comprising first and second tunnel diodes each having characteristics providing high and low voltage states in positive resistance regions separated by a negative resistance region, said first diode being biased to operate in a monostable manner and said second diode being biased to operate in a bistable manner, means to apply an input signal to said first diode to cause it to switch from an initial voltage state to another voltage state and then automatically return to the initial state, a nonlinear impedance unit coupling said first and second diodes to cause the second diode to follow the first diode in switching between its two voltage states, said diodes being biased with relation to the characteristics of said nonlinear impedance unit so that said unit is substantially non-conducting when the first and second diodes are both in their low voltage states or are both in their high voltage states, and becomes substantially conducting in one direction only after the operating point of the first diode encounters the negative resistance region of its characteristic in going from its initial state to its other state, and becomes substantially conducting in the other direction only after the operating point of the first diode encounters the negative resistance region in returning to its initial state.

5. A pulse circuit comprising a first tunnel diode circuit biased to operate in a monostable manner between low and high voltage states, a second tunnel diode circuit biased to operate in a bistable manner between low and high voltage states, means to apply an input signal to said first diode to cause it to switch from its initial voltage state to its other voltage state and automatically return to its initial state, a tunnel rectifier coupling said circuits to cause the second diode to follow the first diode in switching between its two voltage states, said circuits being biased with relation to the characteristics of the tunnel diodes and tunnel rectifier so that said tunnel rectifier is substantially non-conducting when both circuits are in their low voltage states and when both circuits are in their high voltage state, and becomes substantially conducting in one direction only after the first circuit has completed an appreciable portion of its switch from its initial voltage state to its other voltage state, and becomes substantially conducting in the other direction only after the first circuit has completed an appreciable portion of its switch back to its initial voltage state.

References Cited in the file of this patent

UNITED STATES PATENTS

| | | |
|---|---|---|
| 2,666,816 | Hunter | Jan. 19, 1954 |
| 2,951,124 | Hussey | Aug. 30, 1960 |
| 2,965,771 | Finkel | Dec. 20, 1960 |

OTHER REFERENCES

Radio-Electronic Engineering, April 1953, pages 8–10.

Electronic Design, March 19, 1958, page 27.

1960 International Solid-State Circuits Conference, Feb. 10, 1060. Digest of Technical Papers, "The Tunnel Diode as a Logic Element," by M. H. Lewin, A. G. Samusenko, and A. W. Lo, pp. 10–11.

AIEE Conference Paper, January 1960, "Tunnel Diode Circuit Aspects and Applications," by W. F. Chow et al., pp. 15 and 26.